United States Patent
Kao et al.

(10) Patent No.: US 7,026,580 B2
(45) Date of Patent: Apr. 11, 2006

(54) ADJUSTABLE EXHAUST FLOW FOR THERMAL UNIFORMITY

(75) Inventors: Yao-Hwan Kao, Baoshan Shiang (TW); Jia-Sheng Lee, Zhongli (TW); De-Yuan Lu, Taipei (TW); Ming-Fa Chen, Johubei (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 20 days.

(21) Appl. No.: 10/810,978

(22) Filed: Mar. 26, 2004

(65) Prior Publication Data

US 2005/0211695 A1  Sep. 29, 2005

(51) Int. Cl.
*F27B 5/14* (2006.01)

(52) U.S. Cl. ............... 219/390; 219/444.1; 219/443.1; 219/448.17; 219/405; 219/411; 392/416; 392/418; 118/724; 118/725; 118/50.1

(58) Field of Classification Search ............... 219/390, 219/405, 411, 444.1, 443.1, 448.17, 448.12; 392/416, 418; 118/724, 725, 726, 50.1
See application file for complete search history.

(56) References Cited

U.S. PATENT DOCUMENTS

| | | | |
|---|---|---|---|
| 6,264,706 B1 * | 7/2001 | Hirano | 29/25.01 |
| 6,380,518 B1 * | 4/2002 | Shirakawa et al. | 219/390 |
| 6,403,927 B1 * | 6/2002 | Kato | 219/390 |
| 6,554,507 B1 * | 4/2003 | Namatsu | 396/611 |

* cited by examiner

*Primary Examiner*—Shawntina Fuqua
(74) *Attorney, Agent, or Firm*—Duane Morris LLP

(57) ABSTRACT

A method and apparatus for adjusting exhaust flow, and the apparatus has a programmable exhaust control regulator generating a first input signal to a motor control circuit, an exhaust flow meter generating a second input signal to the motor control circuit and a motor driven control valve moved to different positions according to the first and second input signals, the control valve being installed in an exhaust portion of the hot plate apparatus.

15 Claims, 5 Drawing Sheets

ADJUSTABLE EXHAUST FLOW FOR THERMAL UNIFORMITY

FIELD OF THE INVENTION

The invention relates to a hot plate apparatus that is used for numerous heat treating processes. More particularly, the invention relates to adjusting an exhaust flow of the apparatus.

BACKGROUND

A hot plate apparatus is present in a photo lithography section of a semiconductor manufacturing fab for numerous heat treating operations. For example, a post expose bake, PEB, operation will now be described. First, a semiconductor layer is provided with a beginning dielectric layer that will be formed with a damascene or dual damascene structure. A photo resist material, PR material, is applied as a powder coating that will form a photo mask on the beginning dielectric layer. The powder coated wafer is placed on a hot plate that is enclosed by a chamber of the hot plate apparatus.

Heat transfer from the hot plate to the powder coated wafer changes the powder form of the PR material to a fluent state, which then, solidifies to form a continuous PR layer that will subsequently form a photo mask on the beginning dielectric layer. The PR layer must conform with manufacturing specifications to have a uniform thickness and a surface profile of minimum surface roughness. The manufacturing specifications are necessary for subsequent photo lithographic processing of the PR layer to form a patterned mask for making a damascene structure or dual damascene structure in the beginning dielectric layer.

An exhaust flow of air through an exhaust opening, which regulates thermal uniformity in the chamber. The exhaust flow is through an exhaust conduit entrance, for example, through an overhead cover of the hot plate chamber.

The PEB operation eliminates standing waves in PR material to improve the surface profile. The process temperature must be uniform to provide quiescent conditions for the PR material. Thus, a process temperature control limit is a key, or primary, control limit for PEB process control. It has been found that PEB temperature is affected by exhaust flow.

Prior to the invention, the exhaust flow tended to draw particles of powder against the undersurface of the chamber cover. During run time of a PEB process, the powder particles tended to fall from the chamber cover onto a wafer. The fallen powder particles are considered to be contaminant particles on the wafer surface. Subsequent heat curing processing of the wafer caused fallen particles to become crystallized, which lowers the manufacturing yield.

The same wafer is manufactured with successive layers, one on another, that have damascene or dual damascene structures. These structures are defined by selective etching through patterned developed from respective PR layers. The same wafer will have multiple PR layers that are cured by successive PEB processes, which increases the chances for contamination due to fallen powder. Prior to the invention, the hot plate chamber would require frequent cleaning, which contributed to production down-time, while the hot plate apparatus is being cleaned.

A need has existed prior to the invention, to reduce the down time required for preventative maintenance of a hot plate apparatus.

SUMMARY OF THE INVENTION

The present invention provides apparatus for adjusting the exhaust flow to a high level that cleans the hot plate apparatus. Further, the exhaust flow is adjusted for different process control recipes. According to an embodiment, a flow control valve and a flow meter are in the exhaust flow from an apparatus. A stepping motor adjusts the position of the control valve to regulate the exhaust flow. A track main control signals the stepping motor to drive the control valve to different positions. The flow control valve provides a feedback signal that refines the track main control signals to position the valve to a refined position corresponding to a standard exhaust flow of a process control recipe.

DETAILED DESCRIPTION

Figure 1:
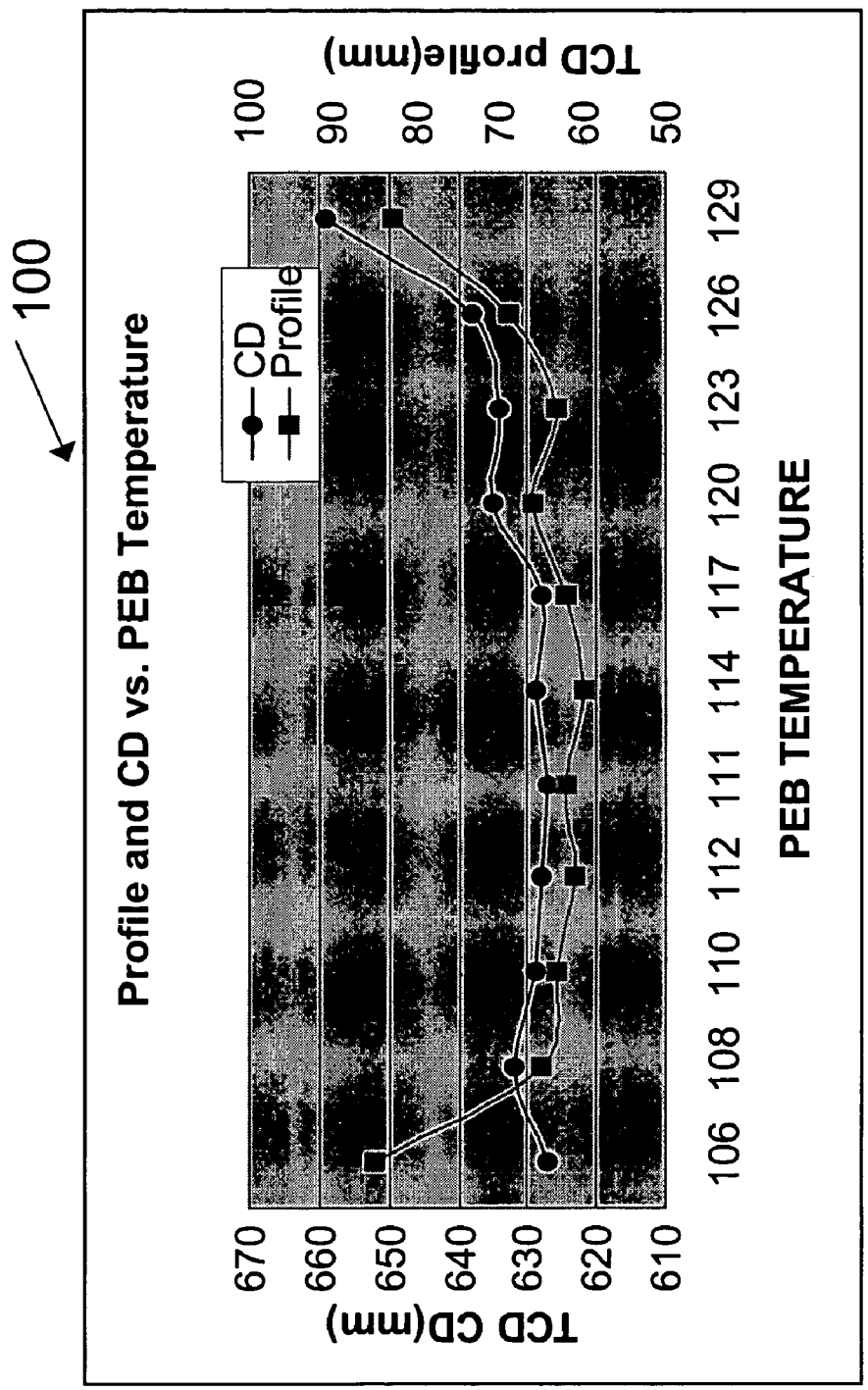
FIG. 1 is a graph of surface profile and CD varying with temperature in a PEB operation.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

A photo resist material in powder form is heat cured to form a continuous photo resist layer. Subsequently, the photo resist layer is patterned for definition of damascene structural elements of miniature and sub-miniature semiconductor devices. The photo resist coating is required to have a uniform thickness with critical dimensions, CD, measured in terms of step height variation per unit area or surface roughness, as measured by surface profile analysis.

FIG. 1 is a graph (100) depicting variations of the CD in nanometers, nm, and the profile in nm, of a photo resist layer for a TCD pattern versus PEB temperature in the hot plate chamber.

Figure 2:
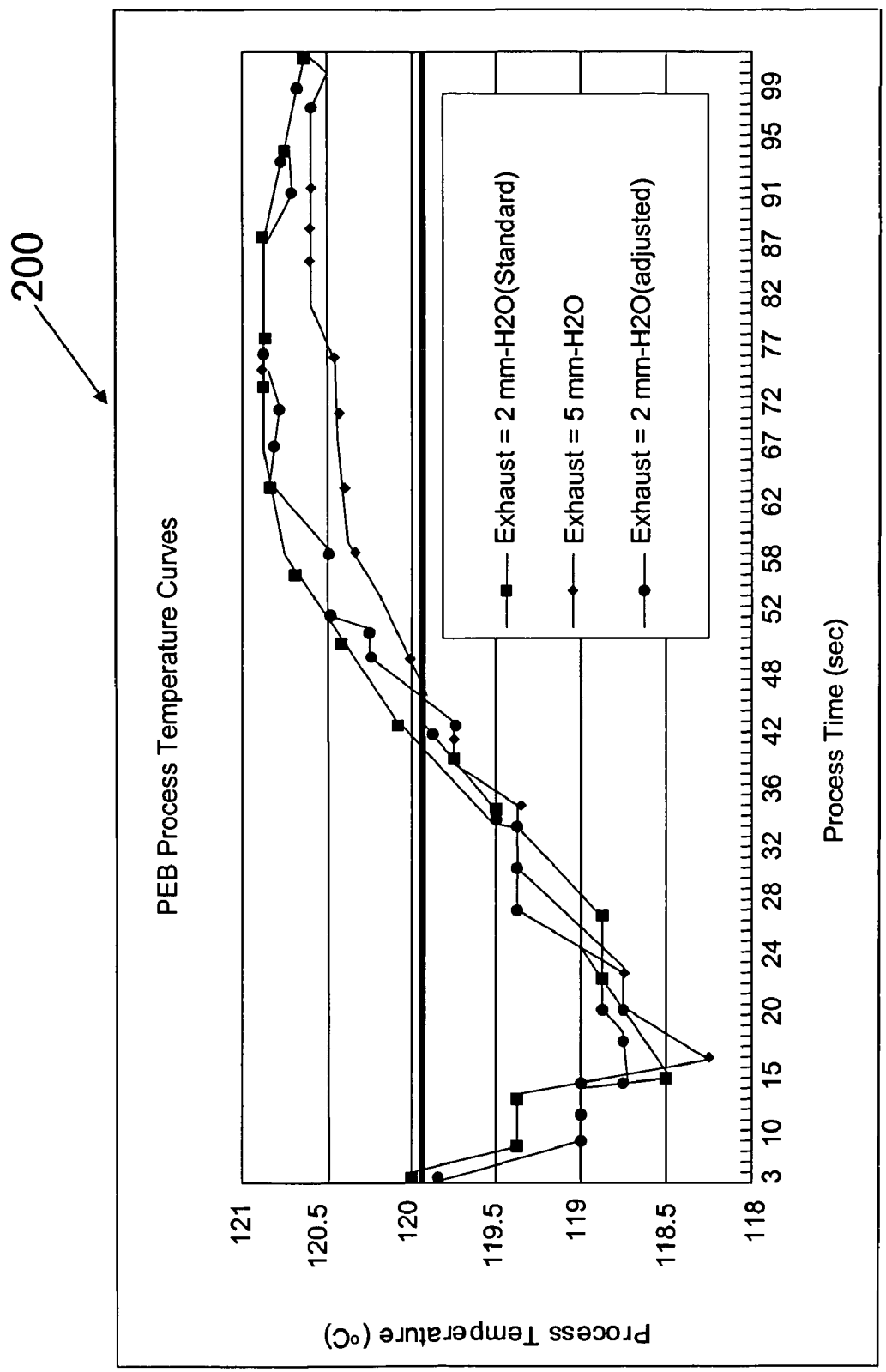
FIG. 2 is a graph of PEB process temperature varying with different exhaust flow levels.

FIG. 2 is a graph (200) depicting variations in PEB temperature with variations in exhaust flow. Above the operating temperature of 120 degrees C., the area under the graph is the heat transfer potential available to cure the powder coated wafer. An exhaust flow standard of 2 mm gauge pressure was established. When the exhaust is adjusted from 5 mm H2O gauge pressure to 2 mm H2O gauge pressure, the temperature variation is maintained within a desired control limit for PEB temperature control. Thus, by adjusting the exhaust flow to a specification standard flow control, the PEB temperature variation or drift can be controlled. The specification standard flow control can be determined by experiment or sample production run, which result in data for constructing the graphs of FIGS. 1 and 2. The specification PEB temperature and exhaust flow becomes a part of the manufacturing recipe for the PR material.

Figure 3:
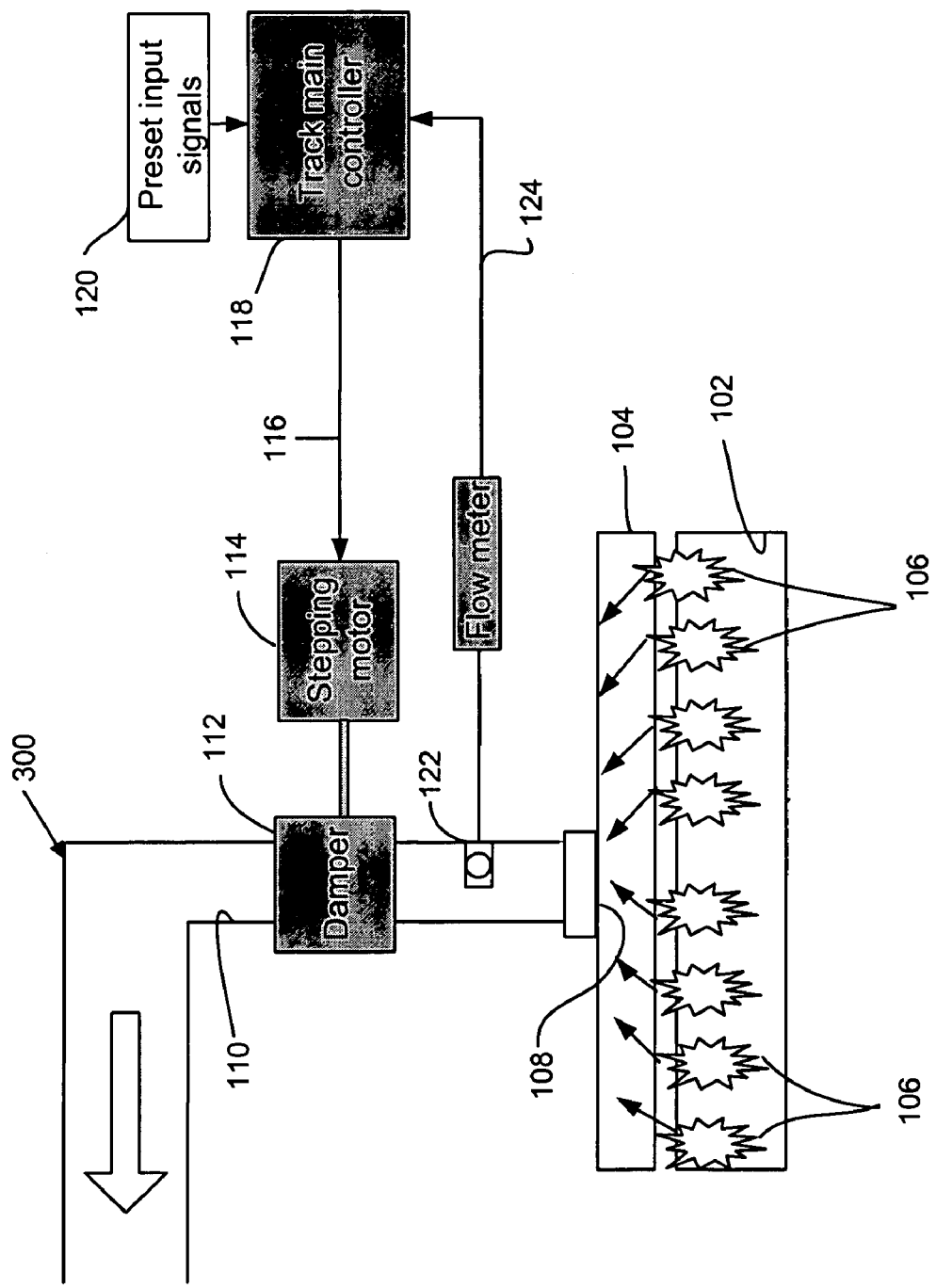
FIG. 3 is a diagrammatic view of an embodiment of the invention.

FIG. 3 discloses a first embodiment of an apparatus (300) for exhaust control. A hot plate apparatus has a hot plate chamber (102) with an overhead chamber cover (104). Contamination particles (106) are diagrammatically depicted. The contamination particles (106) tend to collect at the entrance (108) to an exhaust conduit (110), and collect on the chamber cover (104) in an orbital pattern. A control valve (112) or damper in the PEB exhaust conduit (110) is adjusted to prevent temperature drift. The control valve (112) is adjustable to different positions between closed and open positions in the exhaust conduit (110) for different exhaust flows. A stepping motor (114) is an electrical motor drive that drives the control valve (112) to different positions of adjustment. The stepping motor (114) is in a stepping motor drive circuit (116) with a track main controller (118). the controller (118) is an electrical programmable exhaust control regulator in an input signal circuit (120) that supplies preset input signals to the controller (118). The controller (118) sends an output drive signal to the stepping motor (114). The stepping motor (114) responds to the drive signal to drive the control valve (112) to a position that corresponds to the drive signal. Different drive signals result in different positions of the control valve (112). A flow meter (122) in the conduit (110) near to the chamber cover (104) monitors or detects the exhaust flow. Suitable meter types include, a pressure flow meter type and a mass flow rate meter type. The flow meter (122) sends a continuous feedback signal via a feed back circuit (124) to the controller (118).

During a PEB run-time operation, the specification exhaust flow is set by one of the corresponding programmable preset input signals as an input to circuit (120), and supplied to the track main controller (118). The track main controller (118) supplies a corresponding drive signal to the stepping motor (114). The specification exhaust flow has been determined by experiment or sample run time, which result in measurements of the type disclosed by the graphs of FIGS. 1 and 2.

When the detected exhaust flow is out of spec., as detected by the flow meter (122), a continuous feedback output signal that corresponds to the detected exhaust flow is being supplied as an electrical monitoring input signal in a feedback circuit (126) of the track main controller (118). The feedback output signal from the flow meter (122) refines the drive signal with a refining adjustment of the stepping motor (114) that drives the control valve (112) to a refined position that corresponds to a desired specification exhaust flow that is detected by the flow meter (122)

Figure 4:
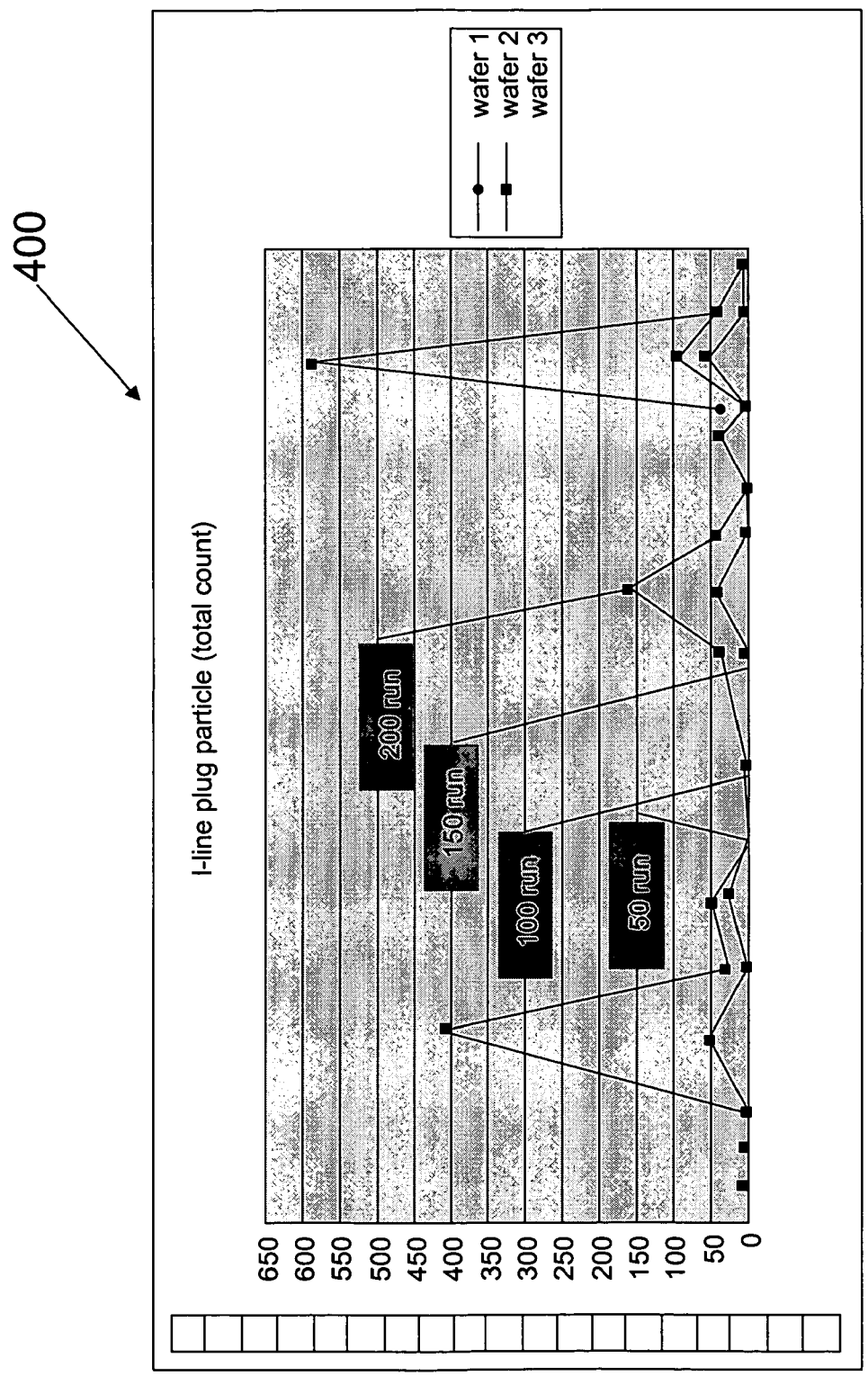
FIG. 4 is a graph of particle counts recorded after a number of PEB production runs.

FIG. 4 is a graph (400) of contamination particle counts that are recorded as data after 50 runs, or wafer processing cycles, after 100 runs, after 150 runs and after 200 runs. The graph indicates that after 150 runs the particle count will be out of spec. during more than 30 runs. Preventative maintenance cleaning would be scheduled as needed, according to data similar to that depicted by FIG. 4.

To reduce the need for preventative maintenance cleaning of the hot plate apparatus (100), the exhaust flow is set to a maximum value to clean the hot plate apparatus (100), by drawing the contamination particles out of the chamber (102) via the exhaust flow. After PEB run time, the PR layer has solidified sufficiently to have a stable surface profile and uniform thickness, while the exhaust flow is increased to a level that cleans the particles from the hot plate chamber (102). The control valve (112) will open fully to a maximum position that increases the exhaust flow to a maximum. The maximum flow rate of the exhaust is set to just below a level that would draw the semiconductor wafer, causing it to move. The maximum flow rate is made a part of the programmable preset input signals supplied to the track main controller (118).

Figure 5:
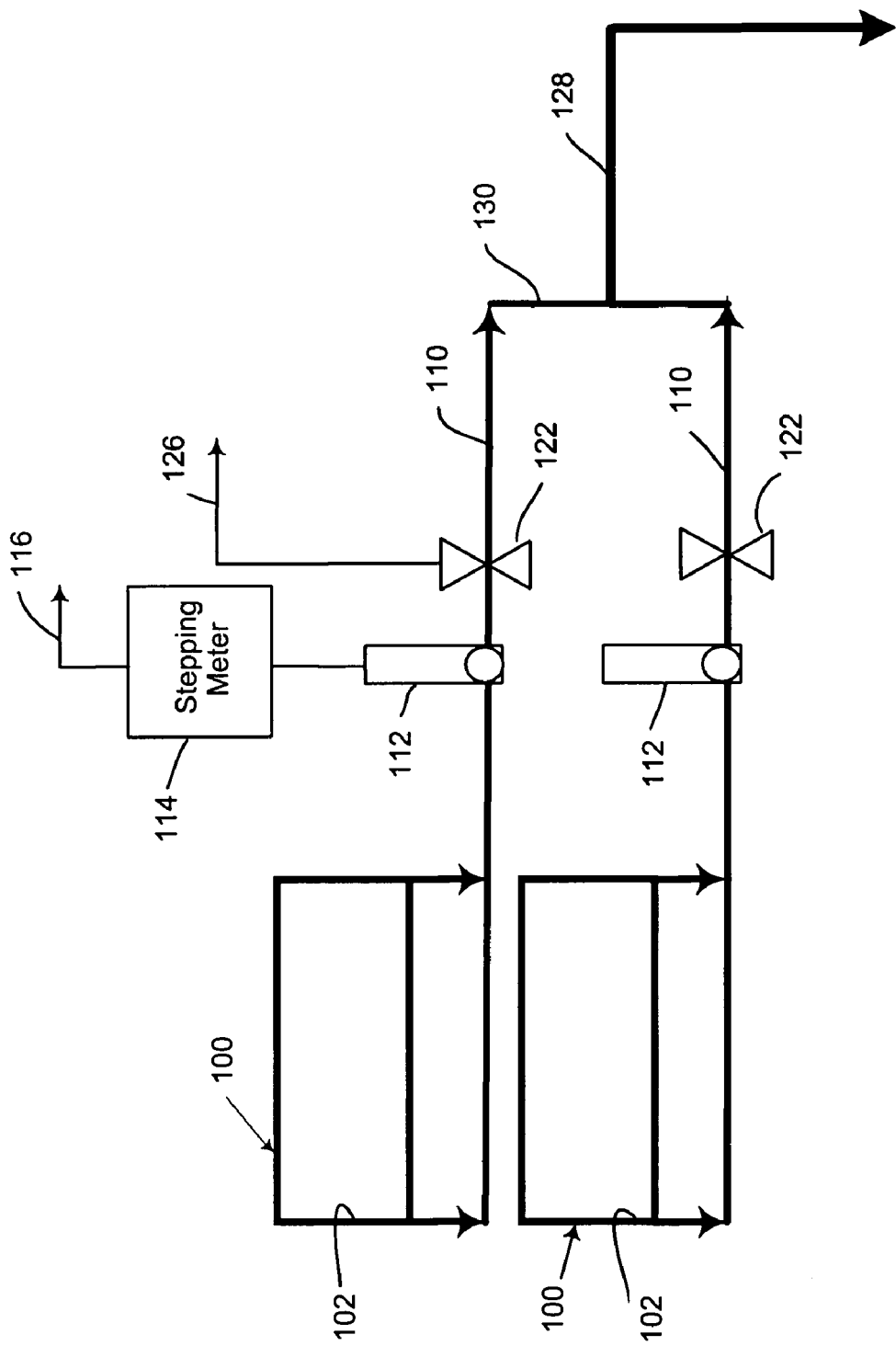
FIG. 5 is a diagrammatic view of another embodiment of the invention.

FIG. 5 discloses an embodiment of the invention for multiple equipment. Not every PEB equipment unit (100) can have its own exhaust. In a fab, a central exhaust (128) is connected by an exhaust manifold (130) having exhaust tubes or conduits (110) extending to multiple equipment units (100). The exhaust flow is distributed among the multiple equipment units (100), with some variation due to different lengths of the exhaust tubes or conduits (110), and different environmental influences on different exhaust tubes or conduits (110). It is impractical to make all the exhaust tubes or conduits (110) the same. Prior to the invention, the exhaust flow in the exhaust tubes or conduits (110) were measured and adjusted to a set amount, while the units (100) were off line, out of production use. Readjustments were required from time to time, also while the units (100) were off line.

FIG. 5 is a diagrammatic view of another embodiment of the present invention. Multiple PEB equipment units (100), for example, two PEB units (100) are provided in one production line. The multiple PEB equipment units (100) are connected by individual exhaust tubes or conduits (110) that communicate with a manifold (130) of a central exhaust conduit (128).

Each exhaust tube or conduit (100) has a control valve (112) and a flow meter (122). Each control valve (110) has a stepping motor (114) connected in a motor drive circuit (116) to the track main controller (124) as disclosed by FIG. 3. Each flow meter (122) is connected in a feedback circuit (126) to the track main controller (124) as disclosed by FIG. 3.

Prior to the invention, one exhaust flow setting was maintained. Changing the exhaust flow of a PEB unit (100) for different PEB recipes was impractical. The cost of having a separate PEB units (100) preset to different exhaust flows was too costly.

Another PR coating process involves PR powder in via openings of a dual damascene structure. The PR coating process includes, for example, the application of a bottom anti reflective coating, BARC, to reduce the reflection of photo exposure light, as well as, the application of a plug filling, etching resist for a dual damascene process. The plug filling, etching resist will plug via openings of the dual damascene structure, to cover exposed metal below the via openings. The PR powder in the via openings would not require thermal uniformity while being heat cured in the PEB unit (100). Thus, the exhaust flow can be set to a relatively strong or high level to deter collection of contamination particles in the PEB unit (100). However, it has been observed that increasing the exhaust flow to a strong or higher level deters powder collection on the chamber cover (104), which reduces the down time required for cleaning the chamber (102). The invention allows changes in exhaust flow settings for different PEB recipes. The highest, or strongest, exhaust setting has a programmable preset input signal to the track main controller (124). A programmable preset input signal can be set to run after completion of each PEB production run to clean the PEB unit (100).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. Apparatus for adjusting exhaust flow in a hot plate apparatus, comprising:
    a programmable exhaust control regulator generating a first input signal to a motor control circuit;
    an exhaust flow meter generating a second input signal to the motor control circuit; and
    a motor driven control valve moveable to different positions according to the first and second input signals, the control valve being installed in an exhaust portion of the hot plate apparatus.

2. The apparatus as in claim 1, further comprising:
    the regulator having an upper limit set below an exhaust flow that would tend to lift a semiconductor wafer in the hot plate apparatus.

3. The apparatus as in claim 1, further comprising:
    the regulator having a preset high exhaust flow for operation at an end of a heating cycle to clean particles from an interior of the hot plate apparatus.

4. The apparatus as in claim 1, further comprising:
    the exhaust portion of the hot plate apparatus being an exhaust conduit communicating with a manifold of a central exhaust conduit.

5. The apparatus as in claim 1, further comprising:
    the exhaust portion of the hot plate apparatus being an exhaust conduit communicating with a manifold of a central exhaust conduit;
    another hot plate apparatus having an exhaust conduit communicating with the manifold;
    another flow control valve in the corresponding exhaust conduit; and
    another flow meter in the corresponding exhaust conduit.

6. A method of controlling a thickness and a surface profile of a photo resist layer, comprising the steps of;
    providing a manufacturing recipe of a photo resist material, the recipe including an exhaust flow value of a PEB apparatus, and
    controlling the exhaust flow of the PEB apparatus to the exhaust flow value while the photo resist material is heated in the PEB apparatus to a solidified photo resist layer of controlled thickness and surface profile.

7. The method as in claim 6, further comprising the step of: varying the exhaust flow with a control valve.

8. The method as in claim 6, further comprising the steps of:
    varying the exhaust flow with a control valve; and
    varying the control valve with a motor.

9. The method as in claim 6, further comprising the steps of:
    varying the exhaust flow with a control valve;
    varying the control valve with a motor;
    driving the motor with a motor drive circuit; and
    providing a first input signal to drive the motor.

10. The method as in claim 6, further comprising the steps of:
    varying the exhaust flow with a control valve;
    varying the control valve with a motor;
    driving the motor with a motor drive circuit;
    providing a first input signal to drive the motor; and
    providing a second refined input signal to drive the motor.

11. A method of cleaning a chamber of a hot plate apparatus, comprising the steps of:
    controlling the exhaust flow of the apparatus to the exhaust flow value while the photo resist material is heated in the apparatus to a solidified photo resist layer; and
    increasing the exhaust flow to clean the chamber.

12. The method as in claim 11, further comprising the step of: varying the exhaust flow with a control valve.

13. The method as in claim 11, further comprising the steps of:
    varying the exhaust flow with a control valve; and
    varying the control valve with a motor.

14. The method as in claim 11, further comprising the steps of:
    varying the exhaust flow with a control valve;
    varying the control valve with a motor;
    driving the motor with a motor drive circuit; and
    providing a first input signal to drive the motor.

15. The method as in claim 11, further comprising the steps of:
    varying the exhaust flow with a control valve;
    varying the control valve with a motor;
    driving the motor with a motor drive circuit;
    providing a first input signal to drive the motor; and
    providing a second refined input signal to drive the motor.

* * * * *